(12) United States Patent
Henry et al.

(10) Patent No.: US 8,242,800 B2
(45) Date of Patent: Aug. 14, 2012

(54) APPARATUS AND METHOD FOR OVERRIDE ACCESS TO A SECURED PROGRAMMABLE FUSE ARRAY

(75) Inventors: G. Glenn Henry, Austin, TX (US); Dinesh K. Jain, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 81 days.

(21) Appl. No.: 12/823,350

(22) Filed: Jun. 25, 2010

(65) Prior Publication Data

US 2011/0316583 A1    Dec. 29, 2011

(51) Int. Cl.
*H03K 19/00* (2006.01)

(52) U.S. Cl. .............................. 326/8; 326/37

(58) Field of Classification Search ......................... None
See application file for complete search history.

(56) References Cited

U.S. PATENT DOCUMENTS

| | | | |
|---|---|---|---|
| 5,369,299 A | 11/1994 | Byrne | |
| 5,808,351 A | 9/1998 | Nathan et al. | |
| 5,966,339 A | 10/1999 | Hsu et al. | |
| 7,561,059 B2 | 7/2009 | Diluoffo et al. | |
| 7,663,957 B2 | 2/2010 | Henry et al. | |
| 7,724,022 B1* | 5/2010 | Deskin et al. | 326/8 |
| 7,795,899 B1* | 9/2010 | Grohoski et al. | 326/8 |
| 2006/0136751 A1* | 6/2006 | Bonaccio et al. | 713/194 |
| 2007/0162759 A1* | 7/2007 | Buskey et al. | 713/182 |
| 2008/0111579 A1 | 5/2008 | Diluoffo et al. | |
| 2009/0296933 A1* | 12/2009 | Akselrod et al. | 380/277 |

* cited by examiner

*Primary Examiner* — Shawki S Ismail
*Assistant Examiner* — Jany Tran
(74) *Attorney, Agent, or Firm* — Richard K. Huffman; James W. Huffman

(57) ABSTRACT

An apparatus in an integrated circuit for re-enabling the use of precluded extended JTAG operations. The apparatus includes a JTAG control chain, a feature fuse, a machine specific register, and an access controller. The JTAG control chain is configured to enable/disable the extended JTAG operations. The feature fuse is configured to indicate whether the extended JTAG features are to be disabled. The machine specific register is configured to store a value therein. The access controller is coupled to the feature fuse, the machine specific register, and the JTAG control chain, and is configured to determine that the feature fuse is blown, and is configured to direct the JTAG control chain to enable the precluded extended JTAG operations if the value matches an override value within the access controller during a period that the value is stored within the machine specific register.

24 Claims, 5 Drawing Sheets

RE-ENABLEMENT OF ARRAY PROGRAMMING FEATURES

MICROPROCESSOR WITH FUSE-ENABLED FEATURES

MECHANISM FOR SECURING A PROGRAMMABLE FUSE ARRAY

FUSE ARRAY TAMPER PROTECTION MECHANISM

METHOD FOR FUSE ARRAY TAMPER PROTECTION

RE-ENABLEMENT OF ARRAY PROGRAMMING FEATURES

APPARATUS AND METHOD FOR OVERRIDE ACCESS TO A SECURED PROGRAMMABLE FUSE ARRAY

CROSS-REFERENCE TO RELATED APPLICATIONS

This application is related to the following co-pending U.S. Patent Applications, each of which has a common assignee and common inventors.

| SERIAL NUMBER | FILING DATE | TITLE |
| --- | --- | --- |
| 12/823,345 (CNTR.2472) | Jun. 25, 2010 | MICROPROCESSOR APPARATUS AND METHOD FOR SECURING A PROGRAMMABLE FUSE ARRAY |
| 12/823,348 (CNTR.2473) | Jun. 25, 2010 | APPARATUS AND METHOD FOR TAMPER PROTECTION OF A MICROPROCESSOR FUSE ARRAY |

BACKGROUND OF THE INVENTION

1. Field of the Invention

This invention relates in general to the field of microelectronics, and more particularly to a an apparatus and method for overriding a tamper protection mechanism for a programmable fuse array within an integrated circuit.

2. Description of the Related Art

Many present day integrated circuits employ metal or polymer fuses disposed on their die to enable and disable functional elements and extended features. Typically these fuses are blown at the factory during fabrication to yield a specific version of a device. For example, a common design for a microprocessor may include a cryptography unit or other security features which are placed on the die, but which are enabled for operation by blowing certain fuses. Accordingly, economies of scale can be achieved during production of the microprocessor while still providing the manufacturer with the ability to easily produce variants of the microprocessor with a range of capabilities and price points.

In more recent years, however, designers have been providing the capability to not only enable/disable these features during fabrication, but also to enable/disable selected features in the field, by providing the mechanisms on chip to allow certain fuses to be blown post production. In most configurations, this field programmability of features is accomplished through sending specific commands and data through the well-known Joint Test Action Group (JTAG) interface/protocol that is present on virtually all microprocessors, cell phone chips, and the like. By sending the proper commands and data, and by perhaps manipulating voltages on specified package pins at prescribed intervals, on-die fuses can be selected and blown, thus enabling or disabling the selected features in the field.

As more and more features are provided that allow for field programmability as described above, the present inventors have noted that the opportunity and motivation exist for an unauthorized user to reconfigure a fielded integrated circuit without the permission of the device manufacturer.

Consequently, what is needed is an apparatus and method for precluding the unauthorized programming of fuses in the field to enable or disable features of a device.

In addition, what is needed is a mechanism for determining if an unauthorized user is attempting to tamper with a device's feature programmability, and for precluding such programming.

Moreover, what is needed is a technique that allows a manufacturer to temporarily re-enable field programming of a device to allow for authorized enablement and disablement of field programmable features.

SUMMARY OF THE INVENTION

The present invention, among other applications, is directed to solving the above-noted problems and addresses other problems, disadvantages, and limitations of the prior art.

The present invention provides a superior technique for precluding the use of extended JTAG operations in an integrated circuit, where these extended JTAG operations are enabled/disabled by blowing fuses. One aspect of the present invention contemplates an apparatus in an integrated circuit for re-enabling the use of precluded extended JTAG operations. The apparatus includes a JTAG control chain, a feature fuse, a level sensor, a machine specific register, and an access controller. The JTAG control chain is configured to enable/disable the extended JTAG operations. The a level sensor is configured to monitor an external voltage signal, and is configured to indicate that said external voltage signal is at a legal level. The feature fuse is configured to indicate whether the extended JTAG features are to be disabled. The machine specific register is configured to store a value therein. The access controller is coupled to the feature fuse, the level sensor, the machine specific register, and the JTAG control chain, and is configured to determine that the feature fuse is blown, and is configured to direct the JTAG control chain to enable the precluded extended JTAG operations if the external voltage signal is at said legal level and if the value matches an override value within the access controller during a period that the value is stored within the machine specific register.

Another aspect of the present invention comprehends an apparatus in an integrated circuit for re-enabling the use of precluded extended JTAG operations. The apparatus includes a microprocessor. The microprocessor has a JTAG control chain, a feature fuse, a level sensor, a machine specific register, and an access controller. The JTAG control chain is configured to enable/disable the precluded extended JTAG operations. The feature fuse is configured to indicate whether the precluded extended JTAG operations are to be disabled. The a level sensor is configured to monitor an external voltage signal, and is configured to indicate that said external voltage signal is at a legal level. The machine specific register is configured to store a value therein. The access controller is coupled to the feature fuse, level sensor, the machine specific register, and the JTAG control chain, and is configured to determine that the feature fuse is blown, and is configured to direct the JTAG control chain to enable the precluded extended JTAG operations if the external voltage signal is at said legal level and if the value matches an override value within the access controller during a period that the value is stored within the machine specific register.

A further aspect of the present invention contemplates a method for re-enabling the use of precluded extended JTAG operations in an integrated circuit. The method includes, via blowing a feature fuse that is disposed within the integrated circuit, indicating that extended JTAG operations are to be disabled; first determining if the feature fuse is blown; second determining if an external voltage signal is at a legal level; third determining if a value in a machine specific register matches and override value; and if the external voltage signal is at the legal level and if the value matches the override value, directing a JTAG control chain to re-enable the precluded extended JTAG operations.

Regarding industrial applicability, the present invention is implemented within a MICROPROCESSOR, which may be used in a general purpose or special purpose computing device.

BRIEF DESCRIPTION OF THE DRAWINGS

These and other objects, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
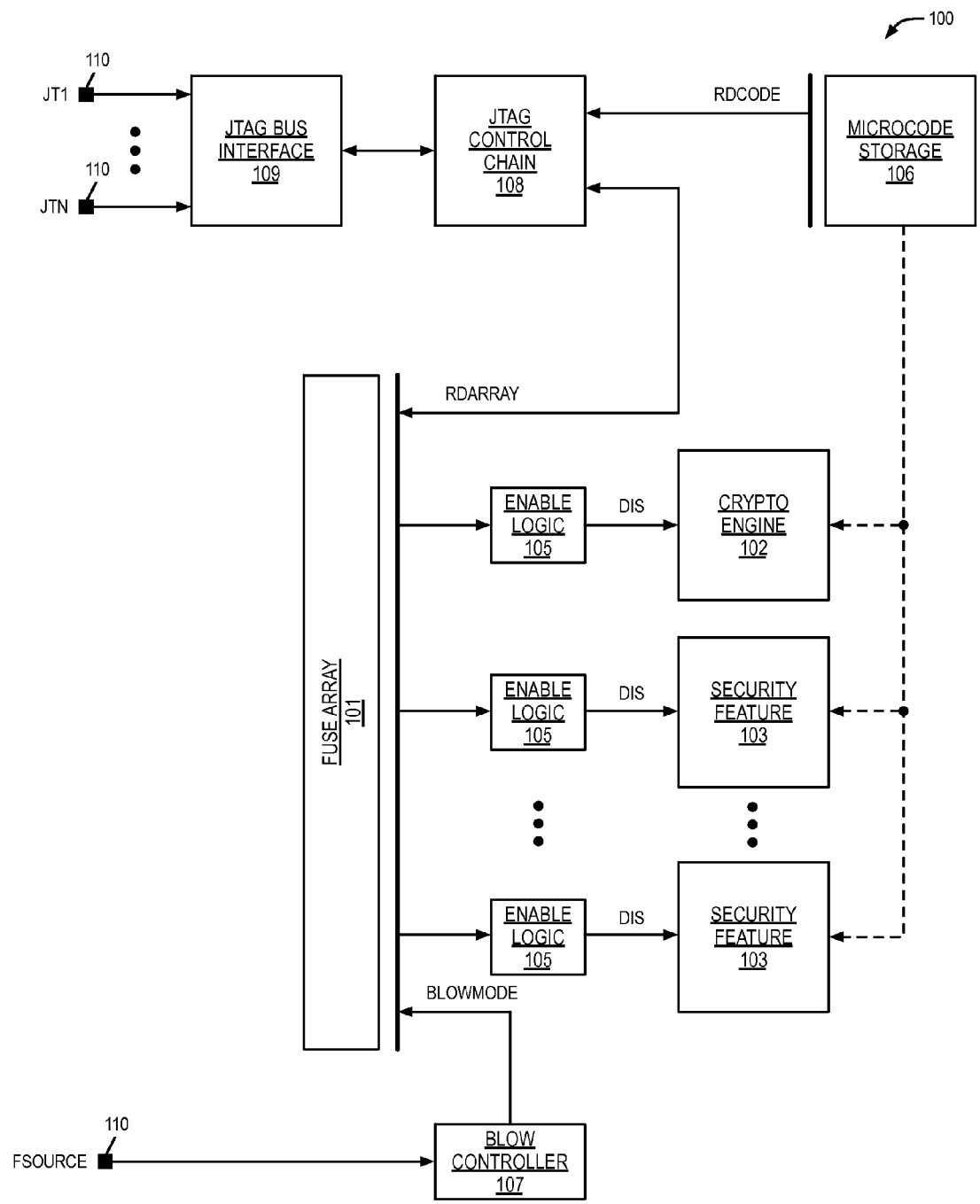
FIG. 1 is a block diagram illustrating a present day microprocessor with fuse-enabled features.

In view of the above background discussion on programmable fuse arrays and associated techniques employed within present day integrated circuits to enable and disable selectable features, a discussion of the disadvantages of present day mechanisms will be presented with reference to FIG. 1. Following this, a discussion of the present invention will be presented with reference to FIGS. 2-5. The present invention overcomes the disadvantages and limitations of current integrated circuits equipped with programmable arrays by providing mechanisms whereby potential sources of tamper are precluded.

Referring to FIG. 1, a block diagram is presented illustrating a present day microprocessor 100 with fuse-enabled features. The microprocessor 100 has a fuse array 101 that is coupled to one or more enable logic elements 105, each of which provide a disable signal DIS to corresponding feature elements 102-103, such as a cryptographic engine 102 or other security features 103.

The fuse array 101 comprises one or more fuses (not shown) which are located upon accessible layers of a die upon which the microprocessor 100 is disposed. These layers may be metal or polymer in nature, and the fuses are blown via laser or any other of several well known techniques during fabrication of the microprocessor 100. In addition, the fuse array 101 is coupled to a blow controller 107 via bus BLOW-MODE. The blow controller 107 receives an externally provided signal FSOURCE which is coupled to a connection pin 110 of a package for the microprocessor 100.

The fuse array 101 is also coupled to a JTAG control chain 108 via bus RDARRAY. The JTAG control chain 108 is coupled to a JTAG bus interface element 109, which communicates with a JTAG controller (not shown) via an JTAG bus JT[1:N]. Each signal of the JTAG bus JT[1:N] is interfaced to a corresponding connection pin 110 on the microprocessor package.

The JTAG control chain 108 is coupled to microcode storage 106, which may comprise temporal storage (e.g., random access memory, registers, and the like), non-temporal storage (e.g., read-only memory, fixed programmable logic, and the like), or a combination of both temporal and non-temporal storage. Microcode (or, "microinstructions") fetched from the microcode storage 106 is directed by known mechanisms to logic elements within the microprocessor 100 to perform programmed sequences of operations. Exemplary logic elements include the cryptographic engine 102 and security features 103, but may also include cache memory, special purpose hardware, power management hardware, or any other type of element that may be enabled/disabled for operation. The logic elements may execute the microcode directly to perform the programmed operations or associated elements (not shown) may execute the microcode to cause the logic elements to be operated upon.

During fabrication of the microprocessor 100, as alluded to above, lasers or other means many be employed to blown certain fuses within the fuse array 101 to indicate that certain security features 103 and/or the crypto engine 102 are disabled. Accordingly, upon power up, each of the enable logic elements 105 determines the state(s) of their corresponding fuses within the array 101 and asserts a corresponding disable signal DIS if indicated. The disable signal DIS precludes operation of its associated feature 102, 103. Thus, a common design may be employed to yield numerous variants of the microprocessor 100, where each of the variants is determined in part by the state of fuses in its array 101. For example, a low performance variant may have fuses blown to disable all its programmable security features 102, 103. And a high performance variant may have fuses programmed to enable all the security features 102, 103.

As discussed above, the state of the fuse array 101 is typically established during fabrication of the microprocessor 100, prior to packaging. However, it has become desirable in more recent years to allow certain features 102-103 to be enabled and disabled in the field. It is beyond the scope of the present application to provide a discussion of the basis for providing such programmability. It is, however, sufficient to note that such capabilities are currently fielded. For example, a blown fuse may indicate that a certain feature 102, 103 is to be enabled, or it may indicate that it is to be disabled. A feature 102, 103 may have multiple fuses associated with it to allow for some finite number of enablements and disablements.

As one skilled in the art will appreciate, the JTAG bus JT[1:N] is employed to provide for certain test and programming functions of the microprocessor. "JTAG" is an acronym that stands for Joint Test Action Group, which is a common standard for the boundary scan and test access architecture that is widely used by those in the art, particularly with regard to microprocessor test and evaluation. Accordingly, the states of the JTAG bus JT[1:N] are manipulated by a test unit, a debugger, or like equipment external to the microprocessor 100. The JTAG bus interface 109 receives the JTAG commands passed over the bus JT[1:N] and routes these signals through the JTAG control chain 108, which is coupled to virtually all testable elements within the microprocessor 100.

In general, JTAG commands are employed to test circuits and elements in the microprocessor 100, however, because JTAG architectures, commands, and associated equipment are common, circuit designers have more recently extended the use of JTAG techniques to allow for other operations in addition to testing, which include verification of programmed microcode in the microcode storage 106 and verification of programmed fuse states in the fuse array 101. To accomplish these operations, associated JTAG commands are routed though the control chain 108 to the microcode storage 106 via bus RDCODE and to the fuse array 101 via bus RDARRAY. Accordingly, an external test unit is provided with the capability to read the state of fuses within the array 101, and to read microcode from within microcode storage 106.

In addition to reading the fuse array 101 and microcode storage 106, JTAG commands provide for blowing certain fuses in the array 101 post-fabrication. Thus, data is sent over the JTAG bus JT[1:N] and is routed through the controller 108 to the array 101 via RDARRAY. Then the voltage on the pin 110 coupled to FSOURCE is set to a state that directs the blow controller 107 to blow the certain fuses. To blow a fuse, appropriate data is scanned via the JTAG bus JT[1:N] into the fuse scan chain over bus RDARRAY, and then commands are sent over the bus JT[1:N] to put the chip into a state where fuse blowing is allowed. The voltage on FSOURCE is set to the appropriate level and is held at that level for a predetermined period of time. In response, the blow controller 107 causes the fuse to be blown.

Typically, on a system board (not shown), FSOURCE is tied to VSS, which is generally 0 volts, or ground level. This is typically necessary to allow the state of the array 101 to be read by the enable logic elements 105 and the JTAG control chain element 108. And to blow a fuse, FSOURCE is raised to the predetermined level, which is dependent upon the particular fabrication technology and also upon how the fuse is implemented (i.e., metal or polymer implementations). For a chip that is fabricated according to 90 nanometer technology, say, the predetermined level for FSOURCE is approximately 3.5 volts. For a 65 nanometer chip, the predetermined level is about 1.7 volts.

Consequently, the present day microprocessor 100 as described above is very flexible with regard feature programmability, both in fabrication and in the field. Such flexibility of architecture enables fabricators and system designers to efficiently and effectively employ common architectures to yield devices with differing capabilities, and at different price points. The architecture described above also enables performance options to be added at the board level, that is, after the microprocessor 100 has been fabricated, packaged, and shipped.

And while such flexibility is very advantageous from a producer's perspective, it is also limiting when viewed from the perspective of unauthorized tampering. That is, while the architecture discussed above enables an authorized user to enable/disable feature elements 102, 103 in a straightforward manner, the same enablement is provided for an unauthorized user. Thus, via the JTAG bus JT[1:N] and FSOURCE, an unauthorized user can read microcode from the microcode storage 106. He/she can read the state of the fuse array 101, and can additionally blow certain fuses to enable or disable certain feature elements 102-103.

As more functions and elements within present day integrated circuits are linked to fuse enablement, the present inventors have noted an increasing need in the art to provide mechanisms and methods to prevent such unauthorized tampering.

The present invention overcomes the limitations and disadvantages of existing integrated circuit architectures having features that are enabled/disabled by programmable fuses by providing mechanisms that detect and preclude unauthorized access to JTAG functions other than normal boundary scan functions. The present invention will now be discussed with reference to FIGS. 2-5.

Figure 2:
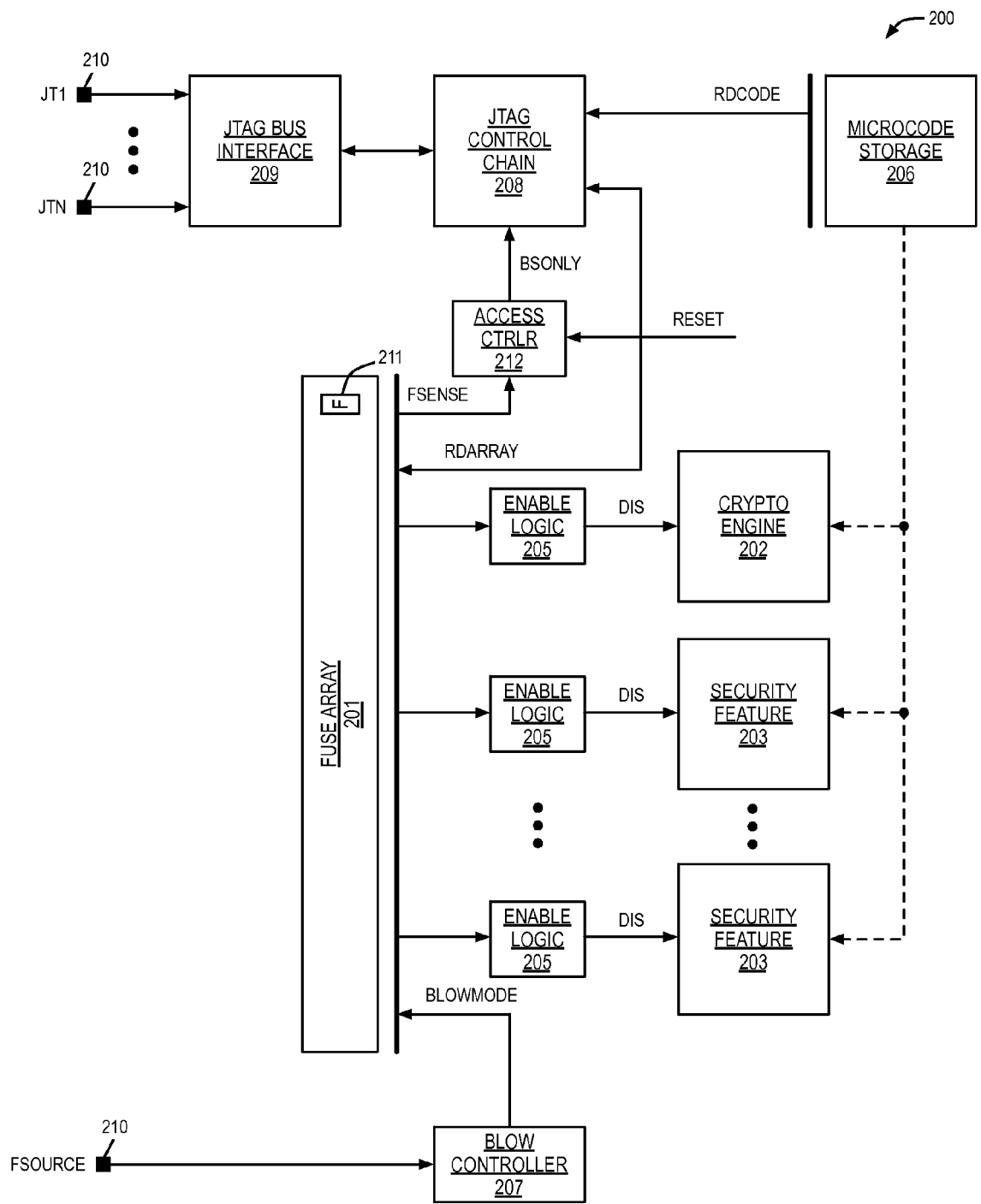
FIG. 2 is a block diagram depicting a mechanism according to the present invention for securing a programmable fuse array.

Turning to FIG. 2, a block diagram is presented depicting a mechanism according to the present invention for securing a programmable fuse array. The diagram depicts a microprocessor 200 which is substantially configured as the prior art microprocessor 100 of FIG. 1. The microprocessor 200 has a fuse array 201 that is coupled to one or more enable logic elements 205, each of which provide a disable signal DIS to corresponding feature elements 202-203, such as a cryptographic engine 202 or other security features 203.

The fuse array 201 comprises one or more fuses (not shown) which are located upon accessible layers of a die upon which the microprocessor 200 is disposed. These layers may be metal or polymer in nature, and the fuses are blown via laser or any other of several well known techniques during fabrication of the microprocessor 200. In addition, the fuse array 201 is coupled to a blow controller 207 via bus BLOWMODE. The blow controller 207 receives an externally provided signal FSOURCE which is coupled to a connection pin 210 of a package for the microprocessor 200.

The fuse array 201 is also coupled to a JTAG control chain 208 via bus RDARRAY. The JTAG control chain 208 is coupled to a JTAG bus interface element 209, which communicates with a JTAG controller (not shown) via an JTAG bus JT[1:N]. Each signal of the JTAG bus JT[1:N] is interfaced to a corresponding connection pin 210 on the microprocessor package.

The JTAG control chain 208 is coupled to microcode storage 206, which may comprise temporal storage (e.g., random access memory, registers, and the like), non-temporal storage (e.g., read-only memory, fixed programmable logic, and the like), or a combination of both temporal and non-temporal storage. Microinstructions fetched from the microcode storage 206 are directed by known mechanisms to logic elements within the microprocessor 200 to perform programmed sequences of operations. Exemplary logic elements include the cryptographic engine 202 and security features 203, but may also include cache memory, special purpose hardware, power management hardware, or any other type of element that may be enabled/disabled for operation. The logic elements may execute the microinstructions directly to perform the programmed operations or associated elements (not shown) may execute the microcode to cause the logic elements to be operated upon.

During fabrication of the microprocessor 200, as alluded to above, lasers or other means many be employed to blown certain fuses within the fuse array 201 to indicate that certain security features 203 and/or the crypto engine 202 are enabled/disabled. Accordingly, upon power up or reset, each of the enable logic elements 205 determines the state(s) of their corresponding fuses within the array 201 and asserts a corresponding disable signal DIS if indicated. The disable signal DIS precludes operation of its associated feature 202, 203.

A blown fuse may indicate that a certain feature 202, 203 is to be enabled, or it may indicate that the certain feature 202, 203 is to be disabled. A feature 202, 203 may have multiple fuses associated with it to allow for some finite number of enablements and disablements.

The JTAG bus JT[1:N] provides for boundary scan and test of the microprocessor 200, and the states of the JTAG bus JT[1:N] are manipulated by a test unit, a debugger, or like equipment external to the microprocessor 200. The JTAG bus interface 209 receives the JTAG commands passed over the bus JT[1:N] and routes these signals through the JTAG control chain 208, which is coupled to virtually all testable elements within the microprocessor 200. In addition to JTAG scan and test features, the architecture of the microprocessor 200 is extended to allow for other operations, which include verification of programmed microcode in the microcode storage 206 and verification of programmed fuse states in the fuse array 201. To accomplish these operations, associated JTAG commands are routed though the control chain 208 to the microcode storage 206 via bus RDCODE and to the fuse array 201 via bus RDARRAY. Accordingly, an external test unit is provided with the capability to read the state of fuses within the array 201, and to read microcode from within microcode storage 206.

In addition to reading the fuse array 201 and microcode storage 106, JTAG commands provide for blowing certain fuses in the array 201 post-fabrication. Thus, data is sent over the JTAG bus JT[1:N] and is routed through the controller 208 to the array 201 via RDARRAY. Then the voltage on the pin 210 coupled to FSOURCE is set to a state that directs the blow controller 207 to blow the certain fuses. To blow a fuse, appropriate data is scanned via the JTAG bus JT[1:N] into the fuse scan chain over bus RDARRAY, and then commands are sent over the bus JT[1:N] to put the chip into a state where fuse blowing is allowed. The voltage on FSOURCE is set to the appropriate level and is held at that level for a predetermined period of time. In response, the blow controller 207 causes the fuse to be blown.

Typically, on a system board (not shown), FSOURCE is tied to VSS, which is generally 0 volts, or ground level, which is necessary to allow the state of the array 201 to be read by the enable logic elements 205 and the JTAG control chain element 208. To blow a fuse, FSOURCE is raised to the predetermined level, which is dependent upon the particular fabrication technology and also upon how the fuse is implemented (i.e., metal or polymer implementations). For a chip that is fabricated according to 90 nanometer technology, say, the predetermined level for FSOURCE is approximately 3.5 volts. For a 65 nanometer chip, the predetermined level is about 1.7 volts.

In contrast to a present day microprocessor 100, the microprocessor 200 according to the present invention provides a mechanism that prevents an unauthorized user from performing any JTAG activity outside of normal boundary scan and test operations. In one embodiment, the microprocessor 200 according to the present invention includes a feature fuse 211 within the array 201 which is blown to indicate that harmful or unauthorized JTAG activity is to be disabled going forward. An access controller 212 is coupled to the feature fuse 211 via bus FSENSE. The access controller 212 receives a microprocessor reset signal and is coupled to the JTAG control chain element 208 via bus BSONLY.

Like other fuses (not shown) within the array 201, the feature fuse 211 may be metal or polymer in composition and may be blown via any of the known techniques during fabrication or via the FSOURCE mechanism described above post-fabrication.

Operationally, upon processor power up or reset, RESET is asserted and the access controller 212 detects the state of the feature fuse 211 over FSENSE. If the fuse 211 is not blown, then the access controller 212 directs the JTAG control chain 208 via BSONLY to allow all JTAG operations, including reading of microinstructions from the microcode storage 206 and reading/blowing of fuses within the fuse array 201. However, if the feature fuse 211 is blown, then the access controller 212 directs the JTAG control chain 208 via BSONLY to preclude all JTAG operations outside of normal boundary scan and test operations. Consequently, when the feature fuse 211 is blown, commands received by the microprocessor 200 over the JTAG bus JT[1:N] to read/blow fuses within the array 201 are ignored or otherwise rendered inoperative, as are commands received that attempt to read the contents of the microcode storage 206.

The access controller 212 according to the present invention is configured to sense the state of the feature fuse 211 and to direct the JTAG control chain 208 to allow/disallow extended JTAG operations as described above. The access controller 212 comprises logic, circuits, devices, or microcode (i.e., micro instructions or native instructions), or a combination of logic, circuits, devices, or microcode, or equivalent elements that are employed to perform the noted functions according to the present invention. The elements employed to perform these functions may be shared with other circuits, microcode, etc., that are employed to perform other functions within the microprocessor 200. According to the scope of the present application, microcode is a term employed to refer to a plurality of micro instructions. A micro instruction (also referred to as a native instruction) is an instruction at the level that a unit executes. For example, micro instructions are directly executed by a reduced instruction set computer (RISC) microprocessor. For a complex instruction set computer (CISC) microprocessor such as an x86-compatible microprocessor, x86 instructions are translated into associated micro instructions, and the associated micro instructions are directly executed by a unit or units within the CISC microprocessor.

Likewise, the JTAG control chain 208 according to the present invention is configured to allow/disallow extended JTAG operations as described above responsive to direction provided by the access controller 212. The JTAG control chain 208 comprises logic, circuits, devices, or microcode (i.e., micro instructions or native instructions), or a combination of logic, circuits, devices, or microcode, or equivalent elements that are employed to perform the noted functions according to the present invention. The elements employed to perform these functions may be shared with other circuits, microcode, etc., that are employed to perform other functions within the microprocessor 200.

In one embodiment, the microprocessor 200 comprises a central processing unit (CPU) that is disposed within a single die of an integrated circuit. In another embodiment, the microprocessor 200 comprises a x86-compatible CPU disposed within a single die of an integrated circuit, and which is capable of superscalar, pipelined execution of x86-compatible macroinstruction which are fetched from a memory over a system bus.

A further embodiment contemplates an integrated circuit disposed on a single die in place of the microprocessor 200, where the integrated circuit provides for fuse programmable feature control as described herein, and where the tamper proof mechanism disclosed above is incorporated into the design of the integrated circuit.

Figure 3:
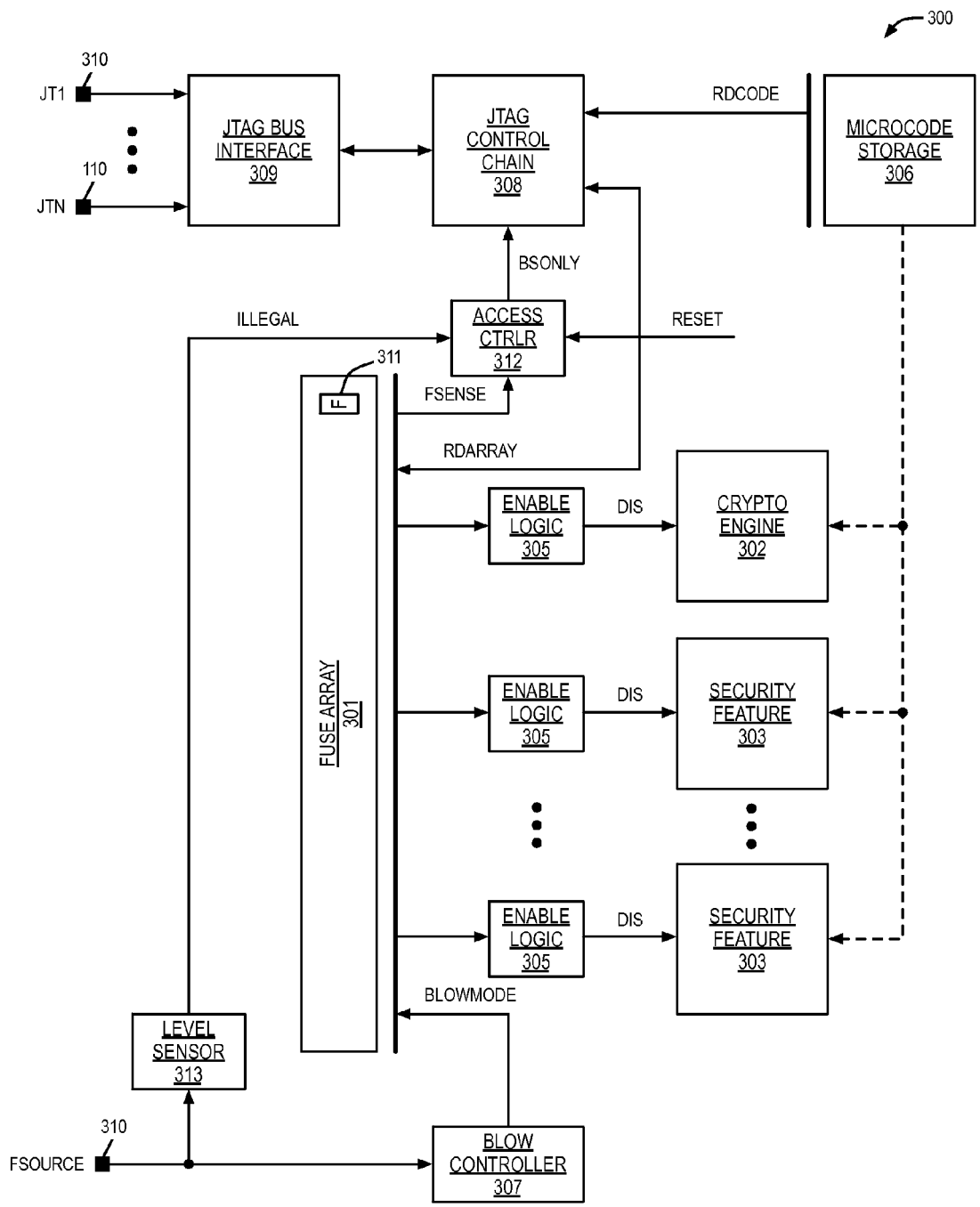
FIG. 3 is a block diagram featuring a fuse array tamper protection mechanism according to the present invention.

Referring now to FIG. 3, a block diagram is presented featuring a fuse array tamper protection mechanism according to the present invention. The diagram depicts a microprocessor 300 which is substantially similar to the microprocessor 200 of FIG. 2. The microprocessor 300 has a fuse array 301 that is coupled to one or more enable logic elements 305, each of which provide a disable signal DIS to corresponding feature elements 302-303, such as a cryptographic engine 302 or other security features 303.

The fuse array 301 comprises one or more fuses (not shown) which are located upon accessible layers of a die upon which the microprocessor 300 is disposed. These layers may be metal or polymer in nature, and the fuses are blown via laser or any other of several well known techniques during fabrication of the microprocessor 300. In addition, the fuse array 301 is coupled to a blow controller 307 via bus BLOWMODE. The blow controller 307 receives an externally provided signal FSOURCE which is coupled to a connection pin 310 of a package for the microprocessor 300.

The fuse array 301 is also coupled to a JTAG control chain 308 via bus RDARRAY. The JTAG control chain 308 is coupled to a JTAG bus interface element 309, which communicates with a JTAG controller (not shown) via an JTAG bus JT[1:N]. Each signal of the JTAG bus JT[1:N] is interfaced to a corresponding connection pin 310 on the microprocessor package.

The JTAG control chain 308 is coupled to microcode storage 306, which may comprise temporal storage (e.g., random access memory, registers, and the like), non-temporal storage (e.g., read-only memory, fixed programmable logic, and the like), or a combination of both temporal and non-temporal storage. Microinstructions fetched from the microcode storage 306 are directed by known mechanisms to logic elements within the microprocessor 300 to perform programmed sequences of operations. Exemplary logic elements include the cryptographic engine 302 and security features 303, but may also include cache memory, special purpose hardware, power management hardware, or any other type of element that may be enabled/disabled for operation. The logic elements may execute the microinstructions directly to perform the programmed operations or associated elements (not shown) may execute the microcode to cause the logic elements to be operated upon.

During fabrication of the microprocessor 300, as alluded to above, lasers or other means many be employed to blown certain fuses within the fuse array 301 to indicate that certain security features 303 and/or the crypto engine 302 are enabled/disabled. Accordingly, upon power up or reset, each of the enable logic elements 305 determines the state(s) of their corresponding fuses within the array 301 and asserts a corresponding disable signal DIS if indicated. The disable signal DIS precludes operation of its associated feature 302-303.

A blown fuse may indicate that a certain feature 302-303 is to be enabled, or it may indicate that the certain feature 302-303 is to be disabled. A feature 302-303 may have multiple fuses associated with it to allow for some finite number of enablements and disablements.

The JTAG bus JT[1:N] provides for boundary scan and test of the microprocessor 200, and the states of the JTAG bus JT[1:N] are manipulated by a test unit, a debugger, or like equipment external to the microprocessor 300. The JTAG bus interface 309 receives the JTAG commands passed over the bus JT[1:N] and routes these signals through the JTAG control chain 308, which is coupled to virtually all testable elements within the microprocessor 300. In addition to JTAG scan and test features, the architecture of the microprocessor 300 is extended to allow for other operations, which include verification of programmed microcode in the microcode storage 306 and verification of programmed fuse states in the fuse array 301. To accomplish these operations, associated JTAG commands are routed though the control chain 308 to the microcode storage 306 via bus RDCODE and to the fuse array 301 via bus RDARRAY. Accordingly, an external test unit is provided with the capability to read the state of fuses within the array 301, and to read microcode from within microcode storage 306.

In addition to reading the fuse array 301 and microcode storage 306, JTAG commands provide for blowing certain fuses in the array 301 post-fabrication. Thus, data is sent over the JTAG bus JT[1:N] and is routed through the controller 308 to the array 301 via RDARRAY. Then the voltage on the pin 310 coupled to FSOURCE is set to a state that directs the blow controller 307 to blow the certain fuses. To blow a fuse, appropriate data is scanned via the JTAG bus JT[1:N] into the fuse scan chain over bus RDARRAY, and then commands are sent over the bus JT[1:N] to put the chip into a state where fuse blowing is allowed. The voltage on FSOURCE is set to the appropriate level and is held at that level for a predetermined period of time. In response, the blow controller 307 causes the fuse to be blown.

Typically, on a system board (not shown), FSOURCE is tied to VSS, which is generally 0 volts, or ground level, which is necessary to allow the state of the array 301 to be read by the enable logic elements 305 and the JTAG control chain element 308. To blow a fuse, FSOURCE is raised to the predetermined level, which is dependent upon the particular fabrication technology and also upon how the fuse is implemented (i.e., metal or polymer implementations). For a chip that is fabricated according to 90 nanometer technology, say, the predetermined level for FSOURCE is approximately 3.5 volts. For a 65 nanometer chip, the predetermined level is about 1.7 volts.

The microprocessor 300 according to the present invention provides a mechanism that prevents an unauthorized user from performing any JTAG activity outside of normal boundary scan and test operations. In one embodiment, the microprocessor 300 according to the present invention includes a feature fuse 311 within the array 301 which is blown to indicate that harmful or unauthorized JTAG activity is to be disabled going forward. An access controller 312 is coupled to the feature fuse 311 via bus FSENSE. The access controller 312 receives a microprocessor reset signal and is coupled to the JTAG control chain element 308 via bus BSONLY. The microprocessor 300 additionally includes a level sensor 313 that receives FSOURCE and which is coupled to the access controller 312 via bus ILLEGAL.

Like other fuses (not shown) within the array 301, the feature fuse 311 may be metal or polymer in composition and may be blown via any of the known techniques during fabrication or via the FSOURCE mechanism described above post-fabrication.

Operationally, upon processor power up or reset, RESET is asserted and the access controller 312 detects the state of the feature fuse 311 over FSENSE. If the fuse 311 is not blown, then the access controller 312 directs the JTAG control chain 308 via BSONLY to allow all JTAG operations, including reading of microinstructions from the microcode storage 306 and reading/blowing of fuses within the fuse array 301. However, if the feature fuse 311 is blown, then the access controller 312 directs the JTAG control chain 208 via BSONLY to preclude all JTAG operations outside of normal boundary scan and test operations. Consequently, when the feature fuse 311 is blown, commands received by the microprocessor 300 over the JTAG bus JT[1:N] to read/blow fuses within the array 301 are ignored or otherwise rendered inoperative, as are commands received that attempt to read the contents of the microcode storage 306.

The present inventors have noted that in some configurations placing a voltage other than VSS on signal FSOURCE causes fuses within the array 301 to generate a state (blown or not blown) other that what is their true state, and it is postulated that an unauthorized user may attempt to tamper with the microprocessor features by establishing such a voltage on FSOURCE such that the value of the feature fuse 311 on FSENSE indicated that extended JTAG operations are enabled, thus providing a means to blow those fuses which can add features 302-303 and/or to read the contents of microcode storage 306. Accordingly, the level sensor 313 monitors the voltage level on FSOURCE and indicates if FSOURCE is at an illegal value (i.e., a value other than VSS) to the access controller 312 via bus ILLEGAL. Consequently, if FSOURCE is at an illegal value when the access controller 312 is reading the state of the feature fuse 311, then the access controller 312 will direct the JTAG control chain 308 to preclude all JTAG operations outside of normal boundary scan and test operations. If FSOURCE is at VSS when the access controller 312 is reading the state of the feature fuse 311, then the access controller 312 will direct the JTAG control chain 308 to allow/disallow extended JTAG operations in accordance with the state of the feature fuse 311.

In one embodiment, the microprocessor 300 comprises a central processing unit (CPU) that is disposed within a single die of an integrated circuit. In another embodiment, the microprocessor 300 comprises a x86-compatible CPU disposed within a single die of an integrated circuit, and which is capable of superscalar, pipelined execution of x86-compatible macroinstruction which are fetched from a memory over a system bus.

A further embodiment contemplates an integrated circuit disposed on a single die in place of the microprocessor 300, where the integrated circuit provides for fuse programmable feature control as described herein, and where the tamper proof mechanism disclosed above is incorporated into the design of the integrated circuit.

Figure 4:
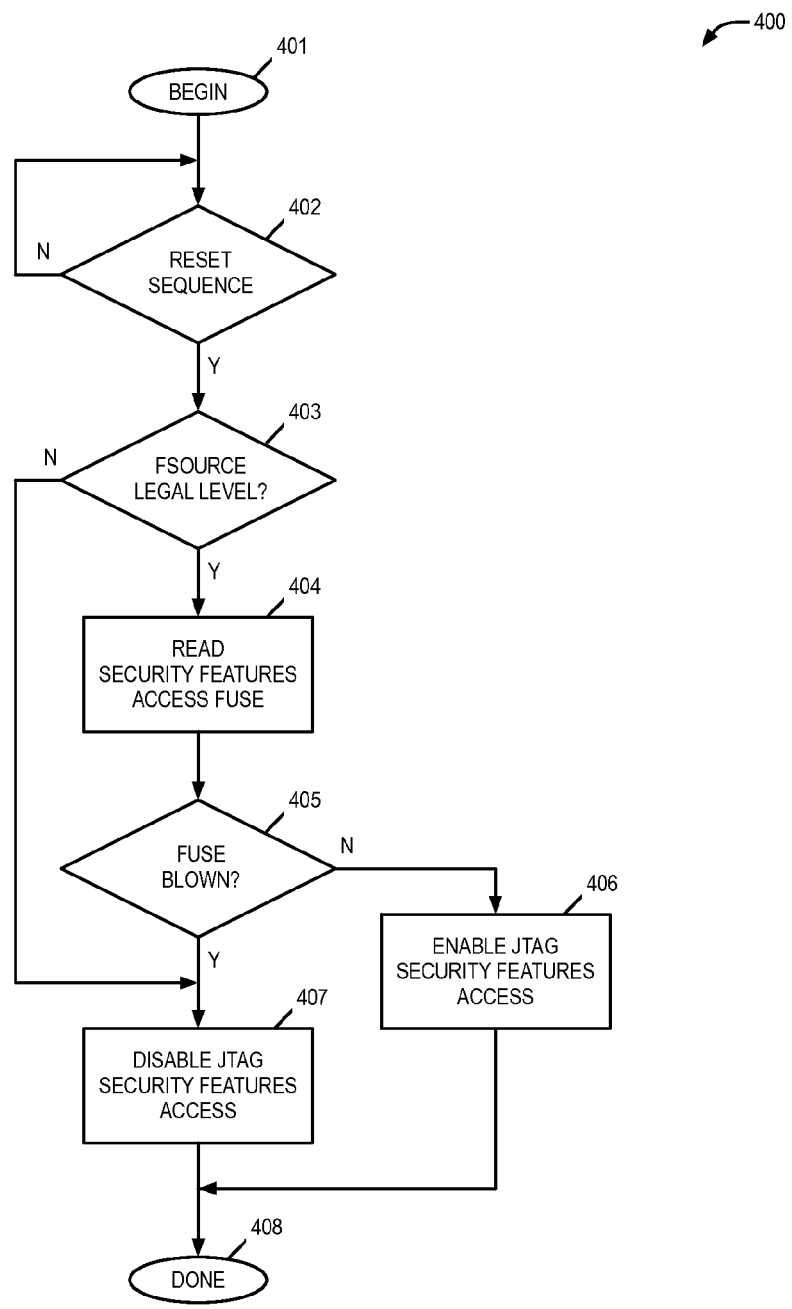
FIG. 4 is a flow diagram showing a method according to the present invention for providing tamper protection for a programmable fuse array.

Now turning to FIG. 4, a flow diagram 400 is presented showing a method according to the present invention for providing tamper protection for a programmable fuse array. Flow begins at block 401 where a microprocessor 300 according to the present invention is configured as in FIG. 4. Flow then proceeds to decision block 401.

At decision block 402, an evaluation is made to determine if the microprocessor 300 is currently performing a sequence of operations corresponding to a reset or power-up sequence. If not, then flow proceeds to this same decision block. If so, then flow proceeds to decision block 403.

At decision block 403, an evaluation is made to determine if the voltage level on FSOURCE is at VSS or at an illegal level. If the level is legal, then flow proceeds to block 404. If the level is not at VSS, then flow proceeds to block 407.

At block 404, the security features access fuse 311 is read by the access controller 312. Flow then proceeds to decision block 405.

At decision block 405, an evaluation is made to determine if the feature fuse 311 is blown. If so, then flow proceeds to block 407. If the fuse is not blown, then flow proceeds to block 406.

At block 406, the access controller 312 directs the JTAG control chain 308 to enable extended JTAG operations. Flow then proceeds to block 408.

At block 407, the access controller directs the JTAG control chain 308 to disable extended JTAG operations, which include reading microcode from the microcode storage 306 and/or reading/blowing fuses within the fuse array 301. Flow then proceeds to block 408.

At block 408, the method completes.

The present inventors have also noted that there may be circumstances under which an integrated circuit having fuse programmable feature enablement as described above may require blowing of fuses in the field to enable or disable certain features, when the feature fuse has already been blown. Instead of being permanently precluded from performing extended JTAG operations, the present invention also contemplates a mechanism for temporarily overriding the tamper proof techniques disclosed with reference to FIGS. 2-4. This mechanism which provides for re-enablement of fuse programmability will now be discussed with reference to FIG. 5.

Figure 5:
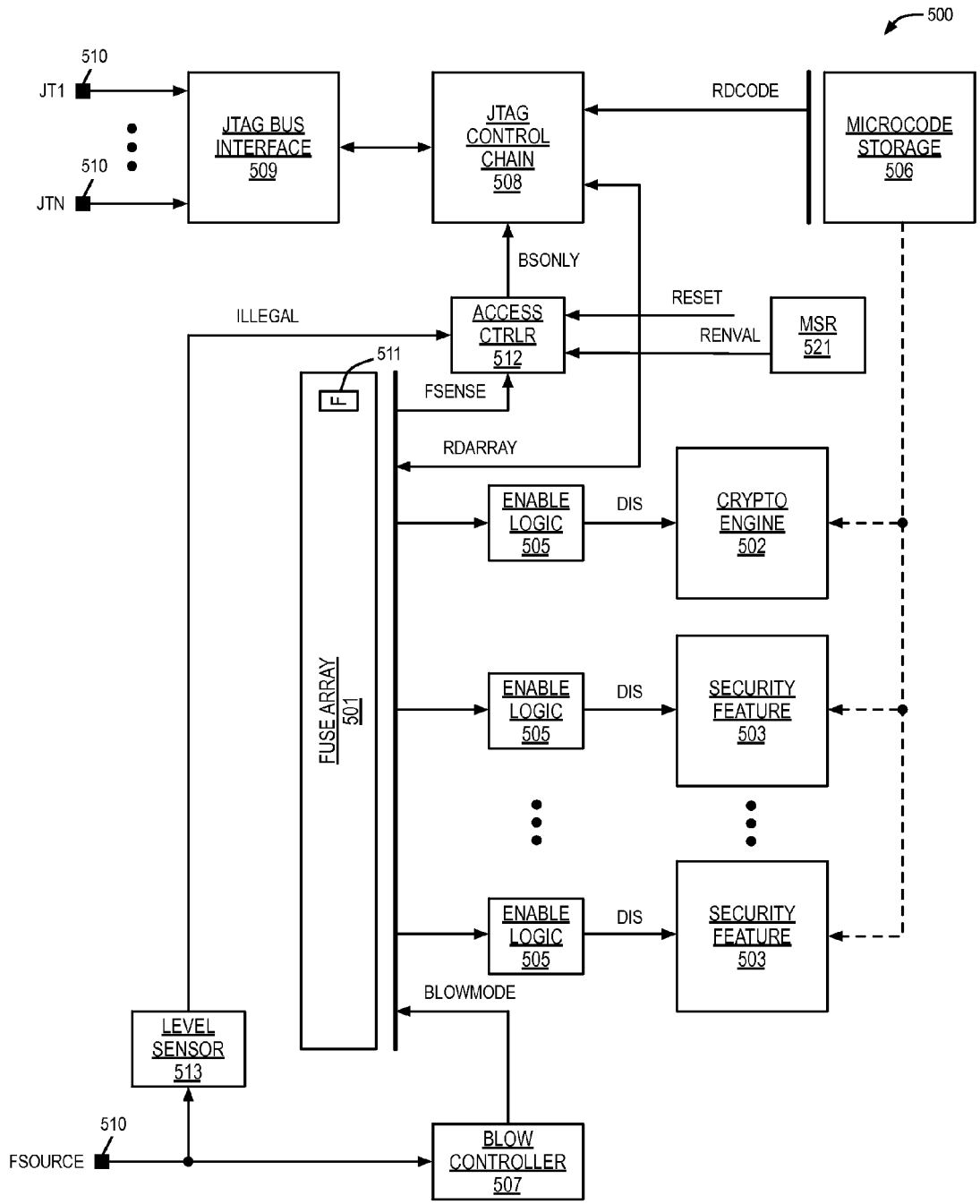
FIG. 5 is a block diagram illustrating a technique according to the present invention that provides for re-enablement of a tamper protected fuse array.

Turning to FIG. 5, a block diagram is presented illustrating a technique according to the present invention that provides for re-enablement of a tamper protected fuse array. The diagram depicts a microprocessor 500 which is substantially similar to the microprocessor 300 of FIG. 3. The microprocessor 500 has a fuse array 501 that is coupled to one or more enable logic elements 505, each of which provide a disable signal DIS to corresponding feature elements 502-503, such as a cryptographic engine 502 or other security features 503.

The fuse array 501 comprises one or more fuses (not shown) which are located upon accessible layers of a die upon which the microprocessor 500 is disposed. These layers may be metal or polymer in nature, and the fuses are blown via laser or any other of several well known techniques during fabrication of the microprocessor 500. In addition, the fuse array 501 is coupled to a blow controller 507 via bus BLOWMODE. The blow controller 507 receives an externally provided signal FSOURCE which is coupled to a connection pin 510 of a package for the microprocessor 500.

The fuse array 501 is also coupled to a JTAG control chain 508 via bus RDARRAY. The JTAG control chain 508 is coupled to a JTAG bus interface element 509, which communicates with a JTAG controller (not shown) via an JTAG bus JT[1:N]. Each signal of the JTAG bus JT[1:N] is interfaced to a corresponding connection pin 510 on the microprocessor package.

The JTAG control chain 508 is coupled to microcode storage 506, which may comprise temporal storage (e.g., random access memory, registers, and the like), non-temporal storage (e.g., read-only memory, fixed programmable logic, and the like), or a combination of both temporal and non-temporal storage. Microinstructions fetched from the microcode storage 506 are directed by known mechanisms to logic elements within the microprocessor 500 to perform programmed sequences of operations. Exemplary logic elements include the cryptographic engine 502 and security features 503, but may also include cache memory, special purpose hardware, power management hardware, or any other type of element that may be enabled/disabled for operation. The logic elements may execute the microinstructions directly to perform the programmed operations or associated elements (not shown) may execute the microcode to cause the logic elements to be operated upon.

During fabrication of the microprocessor 500, as alluded to above, lasers or other means many be employed to blown certain fuses within the fuse array 501 to indicate that certain security features 503 and/or the crypto engine 502 are enabled/disabled. Accordingly, upon power up or reset, each of the enable logic elements 505 determines the state(s) of their corresponding fuses within the array 501 and asserts a corresponding disable signal DIS if indicated. The disable signal DIS precludes operation of its associated feature 502-503.

A blown fuse may indicate that a certain feature 502-503 is to be enabled, or it may indicate that the certain feature 502-503 is to be disabled. A feature 502-503 may have multiple fuses associated with it to allow for some finite number of enablements and disablements.

The JTAG bus JT[1:N] provides for boundary scan and test of the microprocessor 200, and the states of the JTAG bus JT[1:N] are manipulated by a test unit, a debugger, or like equipment external to the microprocessor 500. The JTAG bus interface 509 receives the JTAG commands passed over the bus JT[1:N] and routes these signals through the JTAG control chain 508, which is coupled to virtually all testable elements within the microprocessor 500. In addition to JTAG scan and test features, the architecture of the microprocessor 500 is extended to allow for other operations, which include verification of programmed microcode in the microcode storage 506 and verification of programmed fuse states in the fuse array 501. To accomplish these operations, associated JTAG commands are routed though the control chain 508 to the microcode storage 506 via bus RDCODE and to the fuse array 501 via bus RDARRAY. Accordingly, an external test unit is provided with the capability to read the state of fuses within the array 501, and to read microcode from within microcode storage 506.

In addition to reading the fuse array 501 and microcode storage 506, JTAG commands provide for blowing certain fuses in the array 501 post-fabrication. Thus, data is sent over the JTAG bus JT[1:N] and is routed through the controller 508 to the array 501 via RDARRAY. Then the voltage on the pin 510 coupled to FSOURCE is set to a state that directs the blow controller 507 to blow the certain fuses. To blow a fuse, appropriate data is scanned via the JTAG bus JT[1:N] into the fuse scan chain over bus RDARRAY, and then commands are sent over the bus JT[1:N] to put the chip into a state where fuse blowing is allowed. The voltage on FSOURCE is set to the appropriate level and is held at that level for a predetermined period of time. In response, the blow controller 507 causes the fuse to be blown.

Typically, on a system board (not shown), FSOURCE is tied to VSS, which is generally 0 volts, or ground level, which is necessary to allow the state of the array 501 to be read by the enable logic elements 505 and the JTAG control chain element 508. To blow a fuse, FSOURCE is raised to the predetermined level, which is dependent upon the particular fabrication technology and also upon how the fuse is implemented (i.e., metal or polymer implementations). For a chip that is fabricated according to 90 nanometer technology, say, the predetermined level for FSOURCE is approximately 3.5 volts. For a 65 nanometer chip, the predetermined level is about 1.7 volts.

The microprocessor 500 according to the present invention provides a mechanism that prevents an unauthorized user from performing any JTAG activity outside of normal boundary scan and test operations. In one embodiment, the microprocessor 500 according to the present invention includes a feature fuse 511 within the array 501 which is blown to indicate that harmful or unauthorized JTAG activity is to be disabled going forward. An access controller 512 is coupled to the feature fuse 511 via bus FSENSE. The access controller 512 receives a microprocessor reset signal and is coupled to the JTAG control chain element 508 via bus BSONLY. The microprocessor 500 additionally includes a level sensor 513 that receives FSOURCE and which is coupled to the access controller 512 via bus ILLEGAL.

Like other fuses (not shown) within the array 501, the feature fuse 511 may be metal or polymer in composition and may be blown via any of the known techniques during fabrication or via the FSOURCE mechanism described above post-fabrication.

Operationally, upon processor power up or reset, RESET is asserted and the access controller 512 detects the state of the feature fuse 511 over FSENSE. If the fuse 511 is not blown, then the access controller 512 directs the JTAG control chain 508 via BSONLY to allow all JTAG operations, including reading of microinstructions from the microcode storage 506 and reading/blowing of fuses within the fuse array 501. However, if the feature fuse 511 is blown, then the access controller 512 directs the JTAG control chain 208 via BSONLY to preclude all JTAG operations outside of normal boundary scan and test operations. Consequently, when the feature fuse 511 is blown, commands received by the microprocessor 500 over the JTAG bus JT[1:N] to read/blow fuses within the array 501 are ignored or otherwise rendered inoperative, as are commands received that attempt to read the contents of the microcode storage 506.

In some configurations placing a voltage other than VSS on signal FSOURCE causes fuses within the array 501 to generate a state (blown or not blown) other that what is their true state, and an unauthorized user may attempt to tamper with the microprocessor features by establishing such a voltage on FSOURCE such that the value of the feature fuse 511 on FSENSE indicated that extended JTAG operations are enabled, thus providing a means to blow those fuses which can add features 502-503 and/or to read the contents of microcode storage 506. Accordingly, the level sensor 513 monitors the voltage level on FSOURCE and indicates if FSOURCE is at an illegal value (i.e., a value other than VSS) to the access controller 512 via bus ILLEGAL. Consequently, if FSOURCE is at an illegal value when the access controller 512 is reading the state of the feature fuse 511, then the access controller 512 will direct the JTAG control chain 508 to preclude all JTAG operations outside of normal boundary scan and test operations. If FSOURCE is at VSS when the access controller 512 is reading the state of the feature fuse 511, then the access controller 512 will direct the JTAG control chain 508 to allow/disallow extended JTAG operations in accordance with the state of the feature fuse 511.

However, should it be required to blow fuses or read microcode from the storage 506 after the feature fuse 511 has been blown, the present invention also provides a technique whereby the tamper proof features can be temporarily overridden. Accordingly, the microprocessor 500 also includes a machine specific register 521 that is coupled to the access controller 512 via bus RENVAL. To temporarily re-enable extended JTAG operations if the feature fuse 511 has been blown, it is required that a specific value be present in the register 521. In one embodiment, this specific value is a value known only to the manufacturer of the microprocessor 500, which is stored within the access controller. This value may be common to all microprocessors 500 produced in a certain lot, or it may be a universally known value. In another embodiment, this specific value is a value known only to the manufacturer of the microprocessor 500, which is encrypted via a specified number of rounds according to a prescribed encryption algorithm that is performed by the cryptographic engine, and where a value unique to the microprocessor 500 is used as an encryption key to perform the specified number of rounds.

Accordingly, upon power-up/reset, the access controller 512 determines if FSOURCE is at a legal value. If so, then it determines if the feature fuse 511 has been blown. If the fuse 511 is blown, then the access controller 512 checks the value in the register 521. In one embodiment, if the value in the register 521 matches an override value within the access controller 512, then the access controller 512 directs the JTAG control chain 508 to enable the above-noted JTAG operations. At regular intervals, the register 521 is checked to determine if the originally detected override value is still resident therein. If so, then JTAG extended operations are allowed. However, when the value is no longer detected within the register 521, then the extended JTAG operations are precluded.

In another embodiment, the access controller 512 determines if FSOURCE is at a legal value. If so, then it determines if the feature fuse 511 has been blown. If the fuse 511 is blown, then the access controller 512 checks the value in the register 521 and employs the cryptographic engine in parallel to perform the specified number of rounds using the value unique to the processor 500 as the key. If the value in the register 521 matches the encrypted value, then the access controller 512 directs the JTAG control chain 508 to enable the above-noted JTAG operations. At regular intervals, the register 521 is checked to determine if the originally detected override value is still resident therein. If so, then JTAG extended operations are allowed. However, when the value is no longer detected within the register 521, then the extended JTAG operations are precluded.

In one embodiment, the microprocessor 500 comprises a central processing unit (CPU) that is disposed within a single die of an integrated circuit. In another embodiment, the microprocessor 500 comprises a x86-compatible CPU disposed within a single die of an integrated circuit, and which is capable of superscalar, pipelined execution of x86-compatible macroinstruction which are fetched from a memory over a system bus.

A further embodiment contemplates an integrated circuit disposed on a single die in place of the microprocessor 500, where the integrated circuit provides for fuse programmable feature control as described herein, and where the tamper proof mechanism disclosed above is incorporated into the design of the integrated circuit.

Those skilled in the art should appreciate that they can readily use the disclosed conception and specific embodiments as a basis for designing or modifying other structures for carrying out the same purposes of the present invention, and that various changes, substitutions and alterations can be made herein without departing from the scope of the invention as defined by the appended claims.

What is claimed is:

1. An apparatus in an integrated circuit for re-enabling the use of precluded extended JTAG operations, the apparatus comprising:
    a JTAG control chain, configured to enable/disable the extended JTAG operations;
    a feature fuse, configured to indicate whether the extended JTAG features are to be disabled;
    a level sensor, configured to monitor an external voltage signal, and configured to indicate that said external voltage signal is at a legal level;
    a machine specific register, configured to store a value therein; and
    an access controller, coupled to said feature fuse, said level sensor, said machine specific register, and said JTAG control chain, configured to determine that said feature fuse is blown, and configured to direct said JTAG control chain to enable the precluded extended JTAG operations if said external voltage signal is at said legal level and if said value matches an override value within said access controller during a period that said value is stored within said machine specific register.

2. The apparatus as recited in claim 1, wherein the precluded extended JTAG operations comprise reading of fuse states within a fuse array.

3. The apparatus as recited in claim 1, wherein the precluded extended JTAG operations comprise blowing of fuses within a fuse array.

4. The apparatus as recited in claim 1, wherein the precluded extended JTAG operations comprise reading of microinstructions stored within a microcode storage element.

5. The apparatus as recited in claim 1, wherein said access controller receives a reset signal, and wherein said access controller determines that said feature fuse is blown following assertion of said reset signal, and wherein if said value does not match said override value, said access controller directs said JTAG control chain to disable the precluded extended JTAG operations.

6. The apparatus as recited in claim 1, wherein the integrated circuit comprises a microprocessor.

7. The apparatus as recited in claim 1, wherein only JTAG boundary scan and test operations are enabled when the precluded extended JTAG operations are disabled.

8. The apparatus as recited in claim 1, further comprising:
    a cryptographic engine, operatively coupled to said access controller, configured perform a specified number of rounds according to a prescribed cryptographic algorithm on said value, and configured to provide an encrypted value.

9. An apparatus in an integrated circuit for re-enabling the use of precluded extended JTAG operations, the apparatus comprising:
    a microprocessor, comprising:
        a JTAG control chain, configured to enable/disable the precluded extended JTAG operations;
        a feature fuse, configured to indicate whether the precluded extended JTAG operations are to be disabled;
        a level sensor, configured to monitor an external voltage signal, and configured to indicate that said external voltage signal is at a legal level;
        a machine specific register, configured to store a value therein; and
        an access controller, coupled to said feature fuse, said level sensor, said machine specific register, and said JTAG control chain, configured to determine that said feature fuse is blown, and configured to direct said JTAG control chain to enable the precluded extended JTAG operations if said external voltage signal is at said legal level and if said value matches an override value within said access controller during a period that said value is stored within said machine specific register.

10. The apparatus as recited in claim 9, wherein the precluded extended JTAG operations comprise reading of fuse states within a fuse array.

11. The apparatus as recited in claim 9, wherein the precluded extended JTAG operations comprise blowing of fuses within a fuse array.

12. The apparatus as recited in claim 9, wherein the precluded extended JTAG operations comprise reading of microinstructions stored within a microcode storage element.

13. The apparatus as recited in claim 9, wherein said access controller receives a reset signal, and wherein said access controller determines that said feature fuse is blown following assertion of said reset signal, and wherein if said value does not match said override value, said access controller directs said JTAG control chain to disable the precluded extended JTAG operations.

14. The apparatus as recited in claim 9, wherein said microprocessor comprises an x86-compatible microprocessor.

15. The apparatus as recited in claim 9, wherein only JTAG boundary scan and test operations are enabled when the precluded extended JTAG operations are disabled.

16. The apparatus as recited in claim 9, further comprising:
    a cryptographic engine, operatively coupled to said access controller, configured perform a specified number of rounds according to a prescribed cryptographic algorithm on said value, and configured to provide an encrypted value.

17. A method for re-enabling the use of precluded extended JTAG operations in an integrated circuit, the method comprising:
via blowing a feature fuse that is disposed within the integrated circuit, indicating that extended JTAG operations are to be disabled;
first determining if the feature fuse is blown;
second determining if an external voltage signal is at a legal level;
third determining if a value in a machine specific register matches an override value; and
if the external voltage signal is at the legal level and if the value matches the override value, directing a JTAG control chain to re-enable the precluded extended JTAG operations.

18. The method as recited in claim 17, wherein the precluded extended JTAG operations comprise reading of fuse states within a fuse array.

19. The method as recited in claim 17, wherein the precluded extended JTAG operations comprise blowing of fuses within a fuse array.

20. The method as recited in claim 17, wherein the precluded extended JTAG operations comprise reading of microinstructions stored within a microcode storage element.

21. The method as recited in claim 17, wherein said first and second determining comprises:
receiving a reset signal, and performing said first and second determining following assertion of the reset signal; and
monitoring said value, performing said directing for a period that said value is stored within the machine specific register.

22. The method as recited in claim 17, wherein the integrated circuit comprises a microprocessor.

23. The method as recited in claim 17, further comprising:
enabling only JTAG boundary scan and test when the precluded extended JTAG operations are disabled.

24. The method as recited in claim 17, further comprising:
employing a cryptographic engine to perform a specified number of rounds according to a prescribed cryptographic algorithm on the value, and generating an encrypted value.

* * * * *